United States Patent
Takahashi

(10) Patent No.: US 6,468,700 B1
(45) Date of Patent: Oct. 22, 2002

(54) TRANSFER MASK BLANKS AND TRANSFER MASKS EXHIBITING REDUCED DISTORTION, AND METHODS FOR MAKING SAME

(75) Inventor: Shin-Ichi Takahashi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/479,102

(22) Filed: Jan. 7, 2000

(30) Foreign Application Priority Data

Jan. 12, 1999 (JP) ............................................ 11-005578

(51) Int. Cl.[7] ................................................. G03F 9/00
(52) U.S. Cl. ............................ 430/5; 438/479; 438/480; 437/11
(58) Field of Search ............................ 430/5, 311, 317, 430/318, 330, 308, 309; 438/479, 480; 437/11, 12

(56) References Cited

U.S. PATENT DOCUMENTS

| | | | | |
|---|---|---|---|---|
| 4,668,336 A | * | 5/1987 | Shimkunas | 156/652 |
| 4,994,141 A | * | 2/1991 | Harms et al. | 156/643 |
| 5,227,329 A | * | 7/1993 | Kobayashi et al. | 437/101 |
| 5,679,483 A | * | 10/1997 | Maurer | 430/5 |
| 5,866,302 A | * | 2/1999 | Maysuoka et al. | 430/313 |
| 5,972,794 A | * | 10/1999 | Katakura | 438/704 |
| 6,221,537 B1 | * | 4/2001 | Thompson et al. | 430/5 |
| 6,261,726 B1 | * | 7/2001 | Brooks et al. | 430/5 |

* cited by examiner

Primary Examiner—Janet Baxter
Assistant Examiner—Amanda C. Walke
(74) Attorney, Agent, or Firm—Klarquist Sparkman LLP

(57) ABSTRACT

Transfer mask blanks and masks made using such blanks are disclosed that exhibit minimal tensile stress. Such mask blanks and masks exhibit minimal membrane distortion and pattern deformation whenever a pattern is formed on a membrane of the mask blank. After fabrication, the transfer mask blank is annealed in a $N_2$ atmosphere to reduce the variation in boron concentration to 10% or less through the thickness dimension of the silicon membrane. The resulting uniformity in boron concentration within the silicon membrane reduces tensile stress, which in turn reduces pattern deformation. The silicon membrane is boron doped at a boron concentration in a range of $2 \times 10^{19}$ to $5 \times 10^{20}$ atoms/$cm^3$. This enables the silicon membrane to act as an etch barrier for anisotropic etching using KOH solution.

15 Claims, 5 Drawing Sheets displacement 100 nm (10 MPa)

TRANSFER MASK BLANKS AND TRANSFER MASKS EXHIBITING REDUCED DISTORTION, AND METHODS FOR MAKING SAME

FIELD OF THE INVENTION

This invention pertains primarily to transfer mask blanks and transfer masks employed in microlithography apparatus and methods in which a charged particle beam of electrons, ions, or the like is used to transfer a pattern, defined on the transfer mask, to a suitable substrate such as a semiconductor wafer. Microlithography is used in the fabrication of, e.g., semiconductor integrated circuits and displays.

BACKGROUND OF THE INVENTION

For many years, optical microlithography (microlithography employing visible or ultraviolet light) has been the standard pattern transfer technology used in the manufacture of semiconductor integrated circuits. However, the resolution of optical microlithography systems is limited by the diffraction of light. In recent years the progressively decreasing size and increasing device density of integrated circuits has led to intensive efforts to develop a practical alternative microlithography apparatus that employs a beam of charged particles (e.g., electrons, ions, etc., hereinafter termed a "charged particle beam") or a beam of X-rays to transfer a pattern from a transfer mask (or reticle) to a suitable substrate. Charged-particle-beam (CPB) microlithography systems offer prospects for better resolution, as compared to optical microlithography systems. Current CPB microlithography systems employ a scanning electron beam for exposing a pattern onto a substrate by "writing" the pattern feature-by-feature. By focusing the electron beam to a spot diameter of a few nanometers, such a system can form very fine pattern features, sized 1 μm or smaller.

However, conventional electron-beam exposure systems write only one line at a time, and the finer the pattern the more "focused" the electron beam must be for drawing (i.e., the smaller the "spot diameter," or area illuminated by the beam at any instant). Hence, drawing time is increased and throughput correspondingly decreased. From the perspective of device production costs, electron-beam exposure systems that write the pattern feature-by-feature cannot be used practicably to expose wafers for mass production.

To increase throughput over that obtainable using CPB "writing" systems, CPB projection-transfer apparatus have been proposed. In such apparatus, an electron beam (as a representative charged particle beam) illuminates all or a portion of a pattern defined on a transfer mask. An image of the illuminated region of the transfer mask is demagnified as the image is projected onto a corresponding region of the wafer. Such projection is performed by passing the beam, after propagating through the transfer mask, through a CPB projection-optical system (projection lens) located between the transfer mask and the substrate.

For use in a "demagnifying" (or "reducing") CPB projection-exposure apparatus, a transfer mask (also termed a "reticle") is required upon which a circuit pattern is drawn (i.e., the mask "defines" the circuit pattern). Referring to FIGS. 3(a)–3(b), types of transfer masks currently used with such apparatus include: (1) scattering-transmission masks 11 (FIG. 3(a)), in which pattern features (or pattern "elements") are defined by corresponding CPB-non-scattering regions 15 of a CPB-transmissive membrane 12; and (2) scattering-stencil masks 21 (FIG. 3(b)) in which pattern features are defined by a corresponding pattern of through-holes 24 defined in a membrane 22. The membrane 22 in the scattering-stencil mask of FIG. 3(b) is sufficiently thick to scatter an electron beam, whereas the membrane 12 in the scattering-transmission mask of FIG. 3(a) transmits the electron beam with little to no scattering.

Each of the masks of FIG. 3(a) and FIG. 3(b) is typically divided into multiple small regions 12a and 22a, respectively, that are individually exposed. Each small region 12a, 22a is also termed an "exposure unit" or "subfield" in the art. Each exposure unit 12a, 22a defines a respective arrangement of pattern features or elements (corresponding to the respective portion of the overall pattern defined by the particular exposure unit) to be projection-transferred to a sensitive substrate. The exposure units 12a, 22a are divided from one another on the mask by boundary regions 13a, 23a, respectively, in which no pattern features are defined. The boundary regions 13a, 23a are typically the regions of the mask in which supporting struts 13 and 23, respectively, are located.

In a scattering-stencil mask 21 (FIG. 3(b)), the membrane 22 consists of a silicon membrane, about 2 μm thick, that defines apertures 24 for passage of the electron beam. The pattern of apertures 24 in the membrane 22 of an exposure unit 22a defines the respective portion of the pattern to be transferred to the sensitive substrate (normally situated downstream of the mask).

In either of the masks (FIGS. 3(a)–3(b)), the exposure units 12a, 22a are typically small, each measuring, for example, about 1 mm square (i.e., 1 mm×1 mm). At any one instant, only one exposure unit 12a, 22a is illuminated by the electron beam, and the exposure units of the pattern are typically illuminated in an ordered manner (e.g., sequentially). Each exposure unit 12a, 22a defines a corresponding portion of the overall pattern defined by the mask for transfer to a chip region ("die") on the sensitive substrate. The entire pattern to be exposed onto each die is defined on the respective mask 11, 21 by a large number of exposure units 12a, 22a arrayed over a large area of the mask.

Either of the masks 11, 21 can be used for projection exposure as shown in FIG. 4. A charged particle beam exposes each exposure unit 12a (22a) in a sequential manner. The respective pattern portion corresponding to the respective arrangement of apertures (or non-scattering membrane regions) in each exposure unit 12a (22a) is demagnified (reduced) and transferred to the sensitive substrate 17 by a projection-optical system (not shown). The images of the various exposure units 12a (22a) are positioned relative to each other so as to be "stitched" together on the sensitive substrate 17. As can be seen in FIG. 4, "demagnification" results in an image on the substrate 17 that is smaller than the corresponding region on the mask.

Conventional transfer mask blanks and transfer masks are manufactured by a process as illustrated in FIGS. 5(a)–5(f). A silicon substrate 1, having a (100) crystal-lattice orientation on its surface, is prepared or otherwise provided (FIG. 5(a)). Boron is diffused into the silicon on one side of the substrate 1, either by thermal diffusion or by ion implantation, forming an "activation layer" 2. The activation layer 2 is destined to serve as an etch-stop layer during a later etching step (desirably wet, or anisotropic, etching), and ultimately becomes the silicon membrane of the mask. Regions of the silicon substrate 1, other than the silicon activation layer 2, are known as the "support silicon" 1a (FIG. 5(b)).

Next, a thin film of silicon nitride 3 is formed over the entire surface of silicon substrate 1 (FIG. 5(c)). Selected regions of the silicon nitride film 3 formed on the rear surface of the substrate 1 are removed to form windows 4. The remaining silicon nitride film 3 forms a "wet-etch" mask 5, for use in a subsequent wet-etching step (FIG. 5(d)).

FIG. 5(d) shows a window 4 in one location. But, in actual practice, a large number of windows 4 are formed as required to define corresponding exposure units on the mask.

After forming the wet-etch mask, the entire silicon substrate 1, with wet-etch mask 5 formed thereon, is immersed in an etching solution such as a KOH solution. In the etching solution, anisotropic etching of the support silicon 1a proceeds depthwise into the thickness dimension of the silicon substrate 1 from each window 4 (the windows are regions not protected from etching by the silicon nitride film). When etching reaches the activation layer 2, the depthwise etching rate decreases steeply, so that depthwise wet-etching effectively halts at the activation layer 2 (FIG. 5(e)).

Proper functioning of an activation layer 2 as an etch-stop layer depends upon the boron concentration in the silicon of the activation layer 2. If the boron concentration is less than $2 \times 10^{19}$ atoms/cm$^3$ in the activation layer, then the rate at which depthwise etching decreases at the activation layer is insufficient to adequately prevent etching into the support silicon 1a. Therefore, the boron concentration in the activation layer 2 is desirably at least $2 \times 10^{19}$ atoms/cm$^3$.

After completing wet etching the silicon nitride mask 5 is removed, thereby completing formation of the transfer mask blank (FIG. 5(f)). The completed transfer mask blank consists of the silicon membrane 2a (i.e., the boron-doped silicon activation layer), and silicon struts 1b (which are the remaining portions of the support silicon 1a that were not etched away by the etching solution. The struts 1b thus effectively support the membrane 2a.

To create a stencil-transfer mask from the mask blank shown in FIG. 5(f), the following procedure is typically used:

A layer of resist is applied to the membrane 2a of the transfer mask blank, and the specified mask pattern is transferred to the resist using, e.g., an electron-beam pattern-drawing apparatus. Unexposed regions of the resist are removed, and the corresponding unprotected regions of the membrane 2a are then etched through. Thus, the specified pattern is transferred to the transfer blank, completing formation of the stencil-transfer mask.

A conventional transfer mask blank made according to the previously described manufacturing process (FIGS. 5(a)–5(f)) typically exhibits distortion of the membrane 2a whenever the specified pattern is formed on the membrane 2a. Consequently, the mask pattern is correspondingly deformed.

From studies to determine the cause of membrane distortion, the inventor found that a non-uniform distribution (i.e., variation) of boron concentration exists depthwise in the thickness dimension of a conventional mask. The variation of boron concentration was found to be linked to membrane distortion, and thus to pattern deformation in the finished mask.

FIG. 6 shows a representative variation of boron concentration depthwise in the thickness dimension of a membrane in a conventional transfer mask blank. The boron concentration is plotted on the Y-axis (ordinate), and depth in the thickness dimension of the membrane is plotted on the X-axis (abscissa), with the membrane's outermost surface (the surface at which boron-doping occurred) at X=0. The variation of boron concentration was measured by SIMS (Secondary Ion Mass Spectrometry). This graph of FIG. 6 shows that the boron concentration is highest slightly below the membrane's outermost surface, and that the boron concentration decreases with depth from that surface. The variation in the concentration of boron ("[B]") depthwise through the thickness dimension of the membrane is about 30%, calculated as follows:

$$([B_{max}] - [B_{min}])/[B_{avg}]$$

wherein $[B_{max}]$ is the maximal boron concentration, $[B_{min}]$ is the minimum boron concentration in the membrane, and $[B_{avg}]$ is the average (mean) depthwise concentration of boron. In this example, $[B_{avg}]$ is $1.6 \times 10^{20}$ atoms/cm$^3$.

The inventor also found that tensile stress of the membrane is greatest at or near the membrane surface where the boron concentration is highest. Tensile stress is lower at certain depths (in the thickness dimension) inside the membrane. Hence, after forming a mask pattern on the membrane, the stress curve is convex toward the membrane surface, which causes the membrane (and thus the mask pattern) to become distorted.

In order for an activation layer 2 to function satisfactorily as an etch-stop layer during KOH wet-etching, the boron concentration in the activation layer should be at least $2 \times 10^{19}$ boron atoms/cm$^3$. However, as the inventor has discovered, this does not necessarily imply that the higher the boron concentration the better. As noted above, local tensile stress in the membrane 2a increases with increases in the local boron concentration. Consequently, whenever a pattern is formed on the membrane of a transfer mask blank (in which the silicon activation layer has a high boron concentration), excessive pattern deformation occurs, which is problematic.

Compared to transfer masks used in conventional photolithography, transfer masks used for projection-exposure using a charged particle beam or an X-ray beam require extraordinary accuracy and precision in pattern definition and positioning. Such accuracy and precision is on the order of tens of nanometers, due to the extremely small size of individual elements (features) in integrated circuits manufactured using such methods. These small feature sizes make the problem of distortion of the mask membrane critical to solve.

SUMMARY OF THE INVENTION

In view of the foregoing, one object of the present invention is to provide transfer mask blanks in which tensile stress is substantially reduced, compared to conventional transfer mask blanks. Such mask blanks can be used to form transfer masks that exhibit substantially no pattern deformation. Optimal ranges of certain respective parameters have been found that result in little to no membrane distortion (and thus little to no pattern deformation) in the completed mask.

From the standpoint of reducing tensile stress as much as possible in the mask blank, the boron concentration in the silicon membrane is desirably in a range of $2 \times 10^{19}$ to $5 \times 10^{20}$ atoms/cm$^3$. Furthermore, the variation in boron concentration is desirably no more than 10 percent throughout the membrane, including through the thickness dimension of the membrane. A transfer mask made from such a mask blank exhibits substantially no membrane distortion (and thus no pattern deformation).

Hence, a transfer mask blank according to the present invention comprises a silicon membrane (on which a pattern, to be transferred to a sensitive substrate, will be formed when the mask blank is made into a mask). The silicon membrane is doped with boron at a concentration in the silicon membrane of $2 \times 10^{19}$ to $5 \times 10^{20}$ atoms/cm$^3$. Also, the variation in the boron concentration throughout the silicon membrane is no more than (i.e., $\leq$) 10%. A transfer mask according to the invention comprises a silicon membrane upon which a pattern to be transferred to a sensitive substrate is formed, or that defines such a pattern. The silicon membrane is doped with boron at a concentration in a range of $2 \times 10^{19}$ to $5 \times 10^{20}$ atoms/cm$^3$. The variation in the boron concentration throughout the silicon membrane is no more than (i.e., $\leq$) 10%.

The foregoing and additional features and advantages of the invention will be more apparent from the following detailed description, which proceeds with reference to the accompanying drawings.

BRIEF DESCRIPTIONS OF THE DRAWINGS

FIGS. 5(a)–5(f) illustrate certain respective steps in making a transfer mask blank according to a conventional method and according to the present invention.

Figure 6:
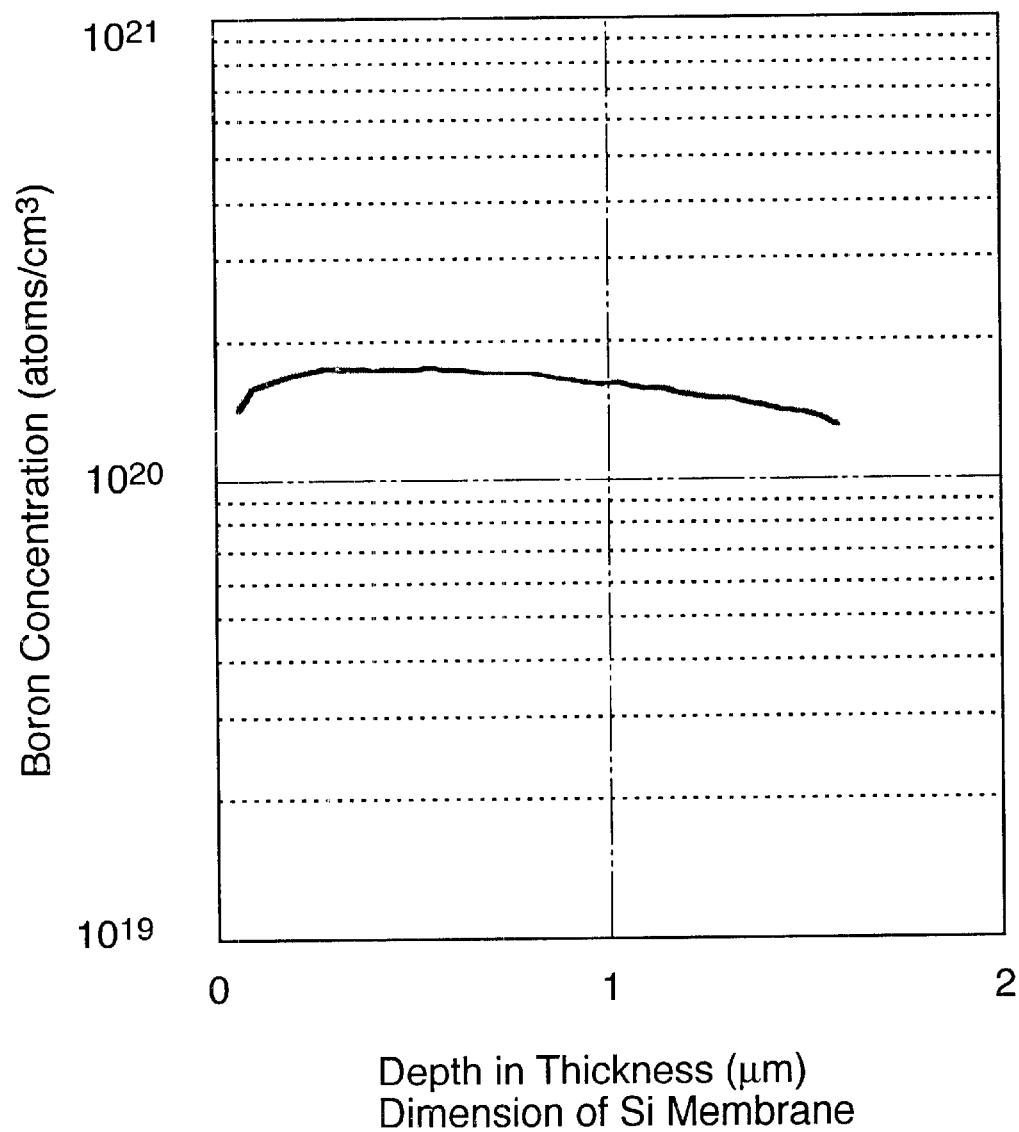

FIG. 6 is a graph of boron concentration as a function of depth in the thickness dimension of the silicon membrane of a conventional transfer mask blank.

DETAILED DESCRIPTION OF THE INVENTION

Figure 5A:
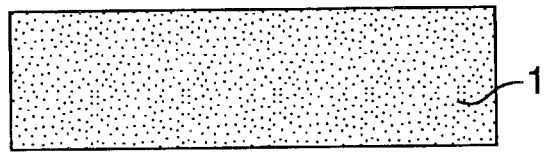
Figure 5B:
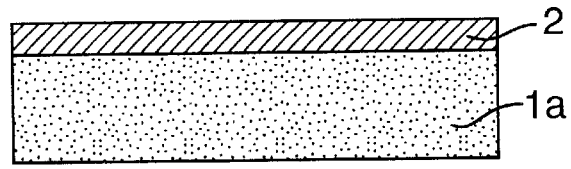
Figure 5C:
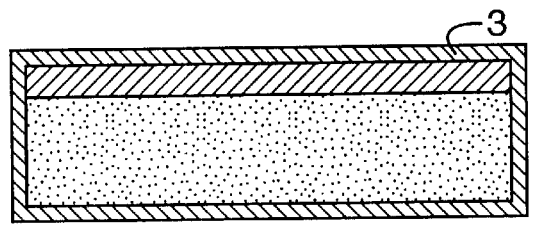
Figure 5D:
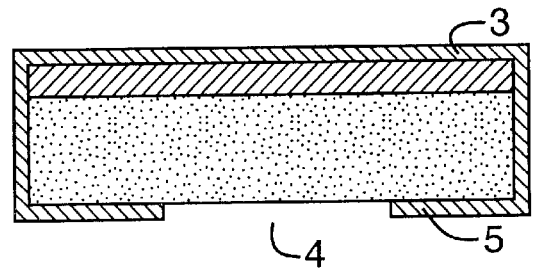
Figure 5E:
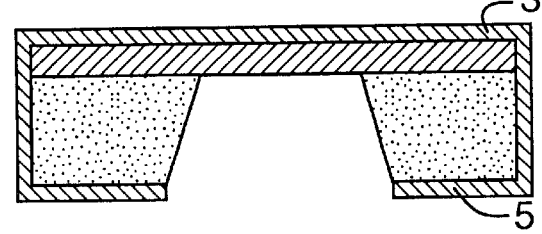
Figure 5F:
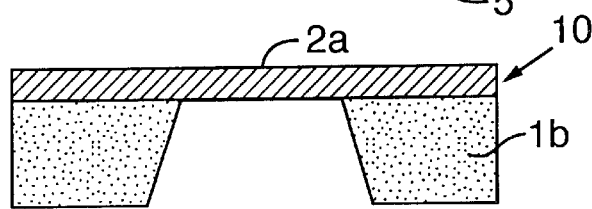

The configuration of a representative embodiment of a transfer mask blank 10 according to the invention can be understood with reference to FIG. 5(f). i.e., as in a conventional transfer mask blank, a transfer mask blank 10 according to the invention comprises a boron-doped silicon membrane 2a (that served as an activation layer during the wet-etching step shown in FIG. 5(e)). The transfer mask blank 10 also includes silicon struts 1b that support the membrane 2a.

Figure 1:
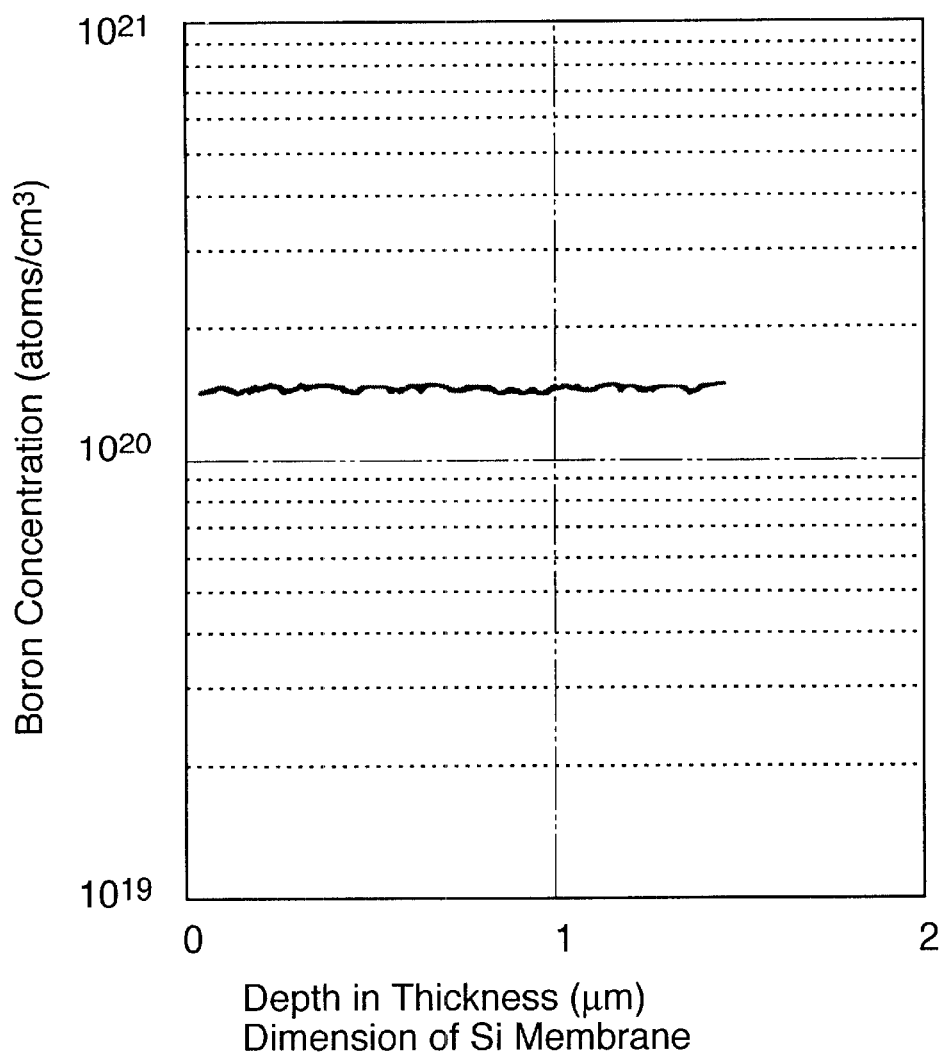
FIG. 1 is a graph of boron concentration as a function of depth in the thickness dimension of a silicon membrane of a representative embodiment of a transfer mask blank according to the present invention.

FIG. 1 is an exemplary graph of depthwise boron concentration in the thickness dimension of the silicon membrane of a transfer mask blank according to the invention. In FIG. 1, the Y-axis (ordinate) is boron concentration, and the X-axis (abscissa) is depth in the thickness dimension, with the membrane's outermost surface at X=0. As can be seen in FIG. 1, depthwise boron concentration within the silicon membrane in this example is substantially constant at $1.46 \times 10^{20}$ atoms/cm$^3$ through the thickness dimension, and the variation in the depthwise boron concentration is $\leq$10%. The tensile stress exhibited by such a membrane is substantially reduced, when compared to a conventional mask blank. Specifically, the local tensile stress exhibited by the FIG. 1 example is no more than approximately 10 MPa.

Figure 2:
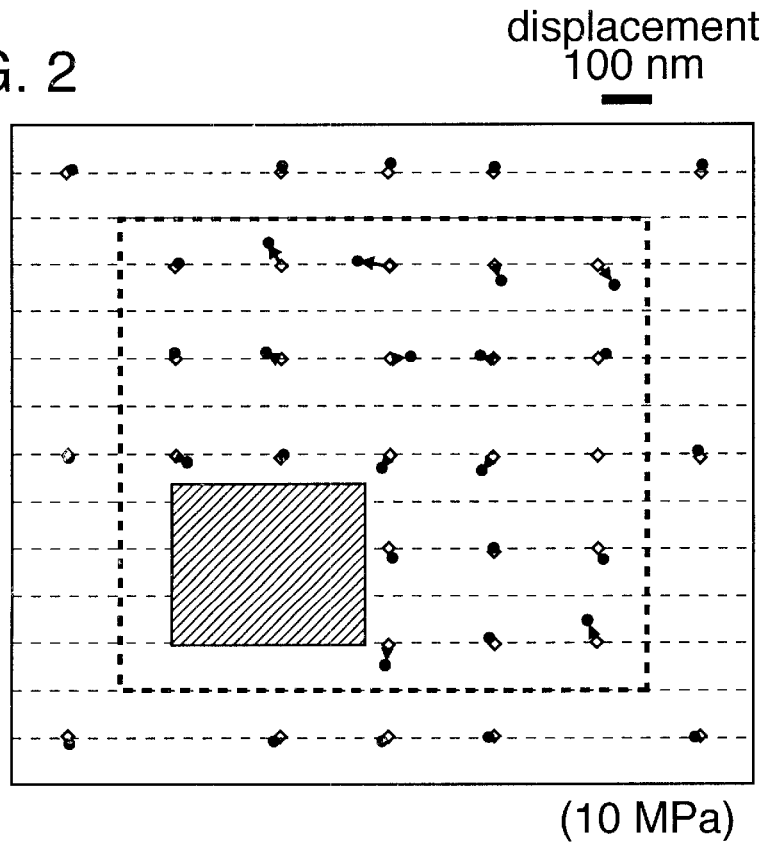
FIG. 2 depicts representative displacements (from ideal) of various locations on a pattern formed on a silicon membrane of a transfer mask blank in which tensile stress is no greater than approximately 10 MPa.
Figure 3B:
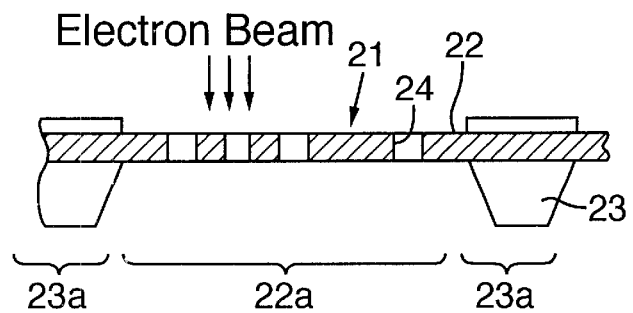
FIG. 3(b) is a schematic sectional view of a portion of a conventional scattering-stencil mask.
Figure 3A:
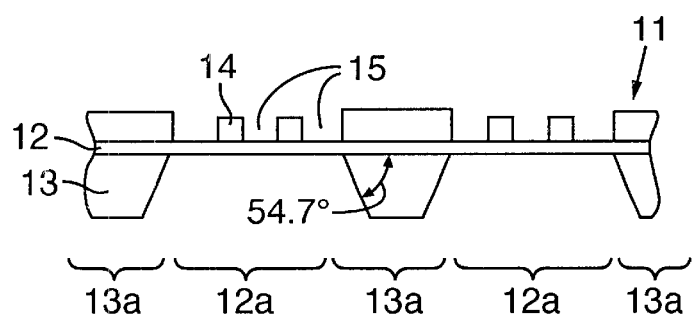
FIG. 3(a) is a schematic sectional view of a portion of a conventional scattering-transmission mask.
Figure 4:
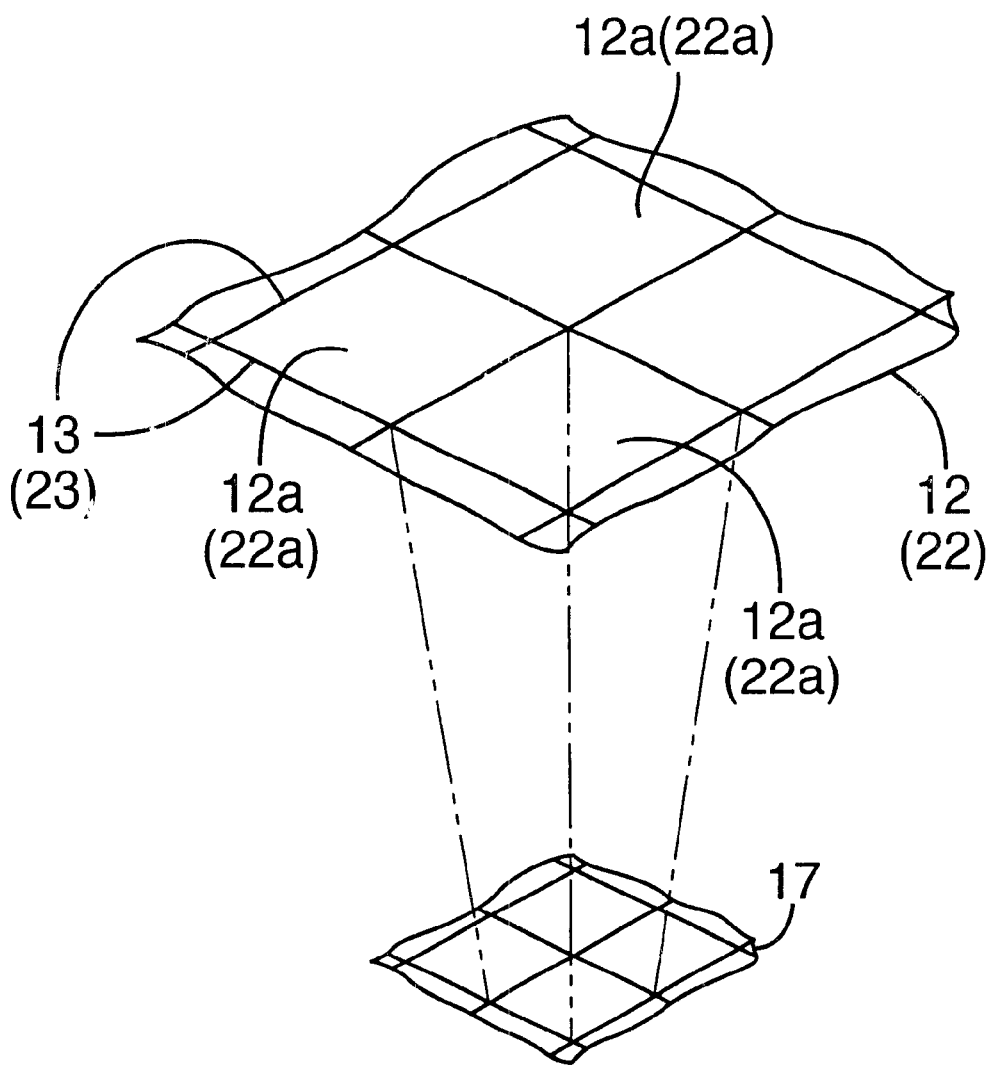
FIG. 4 is a schematic oblique view showing certain aspects of a conventional pattern-transfer method using a charged particle beam.

FIG. 2 shows respective amounts of pattern displacement that can occur at various locations in a pattern formed on the silicon membrane of a transfer mask blank. For a mask made with the mask blank of FIG. 1, localized pattern displacement is reduced to 10 nm or less within an area of 1 mm square on the silicon membrane (in an instance in which the pattern-feature-containing aperture area is 350 $\mu$m square). These displacement measurements can be performed using, e.g., an optical interference-type coordinate-measuring device made by Nikon. In this example, since the variation in depthwise concentration in the thickness dimension of the membrane is no more than 10%, insignificant membrane distortion is exhibited by a mask made from the transfer mask blank.

A representative embodiment of a method for manufacturing a transfer mask blank according to the invention is now described. The method, from the step of preparing the substrate 1 to the step of forming the membrane 2a and struts 1b, is the same as shown in FIGS. 5(a)–5(f). However, in a method according to the invention (and in contrast to conventional methods), after the step shown in FIG. 5(f), the transfer mask blank is annealed in an inert gas atmosphere (for example, N$_2$). Desirably, the annealing pressure of N$_2$ is approximately $10^5$ Pa, the annealing temperature is 1000 to 1200° C., and the annealing time is 2 to 4 hours. Specific values for these parameters are selected according to the membrane thickness.

As noted above, boron desirably is doped to an average concentration of $1.6 \times 10^{20}$ atoms/cm$^3$ in the activation layer 2 prior to annealing. As a result, the activation layer 2 satisfactorily serves as an etch-stop layer during a subsequent wet-etching step, using KOH as the etchant. During the annealing step, the boron in the membrane 2a simply diffuses toward the struts 1b. Also, the mean boron concentration in the membrane 2a tends to decrease during annealing from, by way of example, an initial concentration of approximately $1.6 \times 10^{20}$ atoms/cm$^3$ before annealing to approximately $1.46 \times 10^{20}$ atoms/cm$^3$ after annealing. (Some boron is lost from exposure to the annealing atmosphere.) The annealing treatment parameters such as temperature, annealing time, etc., are determined by the thickness of the membrane 2a and the amount of boron initially doped into the membrane 2a. For example, in a case in which the membrane thickness on the transfer mask blank is about 2 $\mu$m and boron is doped to an average concentration (through the thickness dimension) of $1.6 \times 10^{20}$ atoms/cm$^3$, the annealing temperature is 1150° C. and the annealing time is 3 hours.

The method for manufacturing a transfer mask blank 10 has been described above in the context of forming the struts 1b and the membrane 2a using anisotropic etching (wet etching) as shown in FIGS. 5(a)–5(f). Alternatively, the struts 1b and membrane 2a can be formed by a combination of isotropic etching and anisotropic etching. Isotropic etching is performed through the thickness dimension of the silicon substrate 1, starting from the rear surface of the silicon substrate 1 and progressing toward the activation layer 2. Such isotropic etching can be any of various "dry-etching" methods, such as sidewall-protected plasma etching or very-low-temperature reactive-ion etching. Dry-etching is desirably performed to within to a few $\mu$m (or a few tens of $\mu$m) of the silicon activation layer 2. Dry-etching can be followed by wet-etching (anisotropic etching) of the remaining silicon to the activation layer 2. Such a combination of steps results in relatively narrow struts and allows the resulting mask to be further miniaturized.

As described above, in a transfer mask blank according to the present invention, a specified boron concentration is established in the membrane of the transfer mask blank. Also, the variation in boron concentration depthwise in the thickness dimension of the membrane is limited to no more than 10%, thereby uniformly distributing tensile stress throughout the thickness dimension of the silicon membrane. As a result, membrane distortion is prevented and pattern deformation is suppressed in a mask made from the transfer mask blank.

As a result of the boron concentration in the activation layer being maintained within the range of $2\times10^{19}$ to $5\times10^{20}$ atoms/cm$^3$, the activation layer functions well as an etch-stop layer for wet (anisotropic) etching.

In a mask according to the invention, membrane distortion (with consequent pattern deformation) is suppressed that would otherwise arise due to non-uniform distribution (variation) of tensile stress in the thickness dimension of the membrane. Hence, it is now possible to provide accurate and precise (i.e., on the order of tens of nanometers or less) pattern transfer and positioning of the pattern onto a sensitive substrate by using a charged particle beam. Integrated circuits with extremely small and dense device sizes can be manufactured using such masks.

Whereas the invention has been described above in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A transfer mask blank to be used in forming a transfer mask for use in microlithographically transferring a pattern, defined on the transfer mask, to a sensitive substrate, the transfer mask blank comprising:
   (a) a substrate;
   (b) a silicon layer on a surface of the substrate, the silicon layer being doped with boron at a concentration ranging from $2\times10^{19}$ to $5\times10^{20}$ atoms/cm$^3$; and
   (c) the concentration of boron in the silicon layer exhibiting a variation, depthwise through a thickness dimension of the silicon layer, of no more than 10%.

2. A transfer mask to be used in microlithographically transferring a pattern, defined on the transfer mask, to a sensitive substrate, the transfer mask comprising a silicon layer having a thickness dimension and being doped with boron at a concentration, depthwise through the thickness dimension, in a range of $2\times10^{19}$ to $5\times10^{20}$ atoms/cm$^3$, the boron concentration exhibiting a variation depthwise through the thickness dimension of no more than 10%.

3. A method for manufacturing a transfer mask blank, comprising:
   (a) providing a substrate;
   (b) forming a silicon layer on the substrate, the silicon layer having a thickness dimension;
   (c) doping the silicon layer with boron at a boron concentration, depthwise through the thickness dimension, in a range of $2\times10^{19}$ to $5\times10^{20}$ atoms/cm$^3$, so as to form a transfer mask blank; and
   (d) annealing the transfer mask blank in an inert gas atmosphere to cause the boron concentration, depthwise throughout the thickness dimension of the silicon layer, to exhibit a variation of no more than 10 percent.

4. The method of claim 3, wherein, in step (c), the silicon layer is doped with boron. at an average boron concentration, in the silicon layer, of $1.6\times10^{20}$ atoms/cm$^3$.

5. The method of claim 3, wherein step (d) is performed in a N$_2$ atmosphere.

6. The method of claim 3, including the steps, between steps (c) and (d), of:
   defining a mask region on the substrate; and
   etching the substrate, in locations defined by the mask region, to the doped silicon layer so as to form exposure units separated from one another by struts formed from remaining substrate.

7. A transfer mask blank manufactured by the method of claim 3.

8. A method for manufacturing a transfer mask blank, comprising:
   (a) providing a silicon substrate;
   (b) forming a silicon layer doped with boron at a boron concentration, depthwise through a thickness dimension of the silicon layer, in a range of $2\times10^{19}$ to $5\times10^{20}$ atoms/cm$^3$, to form a transfer mask blank;
   (c) defining a mask region on the silicon substrate;
   (d) etching the substrate, in locations defined by the mask region, to the doped silicon layer so as to form exposure units separated from one another by struts formed from remaining substrate; and
   (e) annealing the transfer mask blank in an inert gas atmosphere to cause the boron concentration, depthwise throughout the thickness dimension of the silicon layer, to exhibit a variation of no more than 10 percent.

9. The method of claim 8, wherein, in step (b), the silicon layer is doped with boron at an average boron concentration, depthwise in a thickness dimension of the silicon layer, of $1.6\times10^{20}$ atoms/cm$^3$.

10. The method of claim 8, wherein step (e) is performed in a N$_2$ atmosphere.

11. A transfer mask blank manufactured by the method of claim 8.

12. A method for manufacturing a transfer mask, comprising:
   (a) providing a silicon substrate;
   (b) forming a silicon layer doped with boron at a boron concentration, depthwise through a thickness dimension of the silicon layer, in a range of $2\times10^{19}$ to $5\times10^{20}$ atoms/cm$^3$, to form a transfer mask blank;
   (c) forming a mask region on the silicon substrate;
   (d) etching the substrate, in locations defined by the mask region, to the doped silicon layer so as to form exposure units separated from one another by struts formed from remaining substrate;
   (e) annealing the transfer mask blank in an inert gas atmosphere to cause the boron concentration, depthwise throughout the thickness dimension of the silicon layer, to exhibit a variation of no more than 10 percent; and
   (f) defining a pattern on or in the silicon layer.

13. The method of claim 12, wherein, in step (b), the silicon layer is doped with boron at an average boron concentration, depthwise through a thickness dimension of the silicon layer, of $1.6\times10^{20}$ atoms/cm$^3$.

14. The method of claim 12, wherein step (e) is performed in a N$_2$ atmosphere.

15. A mask manufactured by the method of claim 12.

* * * * *

UNITED STATES PATENT AND TRADEMARK OFFICE
CERTIFICATE OF CORRECTION

PATENT NO. : 6,468,700 B1
DATED : October 22, 2002
INVENTOR(S) : Takahashi

It is certified that error appears in the above-identified patent and that said Letters Patent is hereby corrected as shown below:

Column 3,
Line 35, "by the etching solution." should be -- by the etching solution.) --.

Column 5,
Line 47, "FIG. 5(f). i.e." should be -- FIG. 5(f). I.e. --.

Column 7,
Line 66, "boron. at" should be -- boron at --.

Signed and Sealed this

Third Day of June, 2003

JAMES E. ROGAN
*Director of the United States Patent and Trademark Office*